United States Patent
Radu et al.

(10) Patent No.: US 8,470,636 B2
(45) Date of Patent: Jun. 25, 2013

(54) AQUEOUS PROCESS FOR PRODUCING CRYSTALLINE COPPER CHALCOGENIDE NANOPARTICLES, THE NANOPARTICLES SO-PRODUCED, AND INKS AND COATED SUBSTRATES INCORPORATING THE NANOPARTICLES

(75) Inventors: Daniela Rodica Radu, West Grove, PA (US); Lynda Kaye Johnson, Wilmington, DE (US); Cheng-Yu Lai, West Grove, PA (US); Meijun Lu, Hockessin, DE (US); Irina Malajovich, Swarthmore, PA (US)

(73) Assignee: E I du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 13/511,699

(22) PCT Filed: Nov. 22, 2010

(86) PCT No.: PCT/US2010/057566
§ 371 (c)(1),
(2), (4) Date: May 24, 2012

(87) PCT Pub. No.: WO2011/066205
PCT Pub. Date: Jun. 3, 2011

(65) Prior Publication Data
US 2012/0288987 A1 Nov. 15, 2012

Related U.S. Application Data

(60) Provisional application No. 61/264,383, filed on Nov. 25, 2009, provisional application No. 61/264,387, filed on Nov. 25, 2009, provisional application No. 61/264,389, filed on Nov. 25, 2009, provisional application No. 61/264,393, filed on Nov. 25, 2009, provisional application No. 61/264,404, filed on Nov. 25, 2009.

(51) Int. Cl.
*H01L 21/00* (2006.01)
(52) U.S. Cl.
USPC ........ 438/95; 438/502; 438/57; 257/E31.004; 977/813; 977/824; 423/1; 423/31; 423/93; 423/102; 428/29; 428/96; 428/172; 428/338
(58) Field of Classification Search
USPC ....... 438/502, 57, 95; 257/E31.004; 977/813, 977/824; 423/1, 31, 93, 102, 508–509, 511, 423/561.1; 428/29, 96, 172, 338, 413, 546, 428/357
See application file for complete search history.

(56) References Cited

U.S. PATENT DOCUMENTS
2010/0226991 A1 9/2010 Horcajada-Cortes et al.

FOREIGN PATENT DOCUMENTS
FR 2921661 A1 4/2009

OTHER PUBLICATIONS

Steinhagen, Chet et al., Synthesis of Cu2ZnSnS4 Nanocrystals for Use in Low-Cost Photovoltaics, Journal of the American Chemical Society, 2009, pp. 12554-12555, vol. 131.
Guo, Qijie et al., Synthesis of Cu2ZnSnS4 Nanocrystal Ink and Its Use for Solar Cells, Journal of the American Chemical Society, 2009, pp. 11672-11673, vol. 131.
Riha, Shannon C. et al., Solution-Based Synthesis and Characterization of Cu2ZnSnS4 Nanocrystals, Journal of the American Chemical Society, 2009, pp. 12054-12055, vol. 131.

*Primary Examiner* — Evan Pert
*Assistant Examiner* — Mark A Laurenzi

(57) ABSTRACT

The present invention relates to aqueous processes to make metal chalcogenide nanoparticles that are useful precursors to copper zinc tin sulfide/selenide and copper tin sulfide/selenide. In addition, this invention provides processes for preparing crystalline particles from the metal chalcogenide nanoparticles, as well as processes for preparing inks from both the metal chalcogenide nanoparticles and the crystalline particles.

10 Claims, 4 Drawing Sheets

US 8,470,636 B2

AQUEOUS PROCESS FOR PRODUCING CRYSTALLINE COPPER CHALCOGENIDE NANOPARTICLES, THE NANOPARTICLES SO-PRODUCED, AND INKS AND COATED SUBSTRATES INCORPORATING THE NANOPARTICLES

CROSS REFERENCE TO RELATED APPLICATIONS

This application claims priority under 35 U.S.C. §119(e) from, and claims the benefit of, the following U.S. Provisional Applications: No. 61/264,383, No. 61/264,387, No. 61/264,389, No. 61/264,393, and No. 61/264,404; each of which was filed on Nov. 25, 2009, and each of which is by this reference incorporated in its entirety as a part hereof for all purposes.

FIELD OF THE INVENTION

The present invention relates to aqueous processes to make metal chalcogenide nanoparticles that are useful precursors to copper zinc tin sulfide/selenide and copper tin sulfide/selenide. In addition, this invention provides processes for preparing crystalline particles from the metal chalcogenide nanoparticles, as well as processes for preparing inks from both the metal chalcogenide nanoparticles and the crystalline particles.

BACKGROUND

Crystalline multinary-metal chalcogenide compositions, including particles and layers, are useful materials, having applications in catalysis and electronics, including uses as semiconductors, conductors, and thermoelectrics.

Crystalline multinary-metal chalcogenide compositions containing only non-toxic and abundant elements are of particular interest in developing environmentally sustainable processes and devices. Copper tin sulfide ($Cu_2SnS_3$ or "CTS") and copper zinc tin sulfide ($Cu_2ZnSnS_4$ or "CZTS") are particularly useful examples of this class of materials. CTS belongs to a group of compounds, represented by the general formula $IB_2$-$IVA$-$VIA_3$, which are of interest due to their potential applications as small band-gap semiconductors, as nonlinear materials, and as suitable candidates for photovoltaic cell materials.

Thin-film photovoltaic cells typically use semiconductors such as CdTe or copper indium gallium sulfide/selenide (CIGS) as an energy absorber material. Due to toxicity of cadmium and the limited availability of indium, alternatives are sought. CZTS possesses a band gap energy of about 1.5 eV and a large absorption coefficient (approx. $10^4$ cm$^{-1}$), making it a promising CIGS replacement.

Challenges in making CZTS thin-films are illustrative of the general challenges that must be surmounted in making films of crystalline multinary-metal chalcogenide compositions. Current techniques to make CZTS thin films (e.g., thermal evaporation, sputtering, hybrid sputtering, pulsed laser deposition and electron beam evaporation) require complicated equipment and therefore tend to be expensive. Electrochemical deposition is an inexpensive process, but compositional non-uniformity and/or the presence of secondary phases prevents this method from generating high-quality CZTS thin-films. CZTS thin-films can also be made by the spray pyrolysis of a solution containing metal salts, typically $CuCl$, $ZnCl_2$, and $SnCl_4$, using thiourea as the sulfur source. This method tends to yield films of poor morphology, density and grain size. Photochemical deposition has also been shown to generate p-type CZTS thin films. However, the composition of the product is not well-controlled, and it is difficult to avoid the formation of impurities such as hydroxides.

The synthesis of CZTS nanoparticles stabilized with organic amines and processed with organic solvents has also been disclosed. Layers of these nanoparticles were deposited on substrates by standard coating techniques. Subsequent annealing in a nitrogen and sulfur atmosphere leads to the formation of CZTS films. However, it is difficult to tune the molar ratio of elements in the CZTS powder, which affects the ultimate performance of the CZTS thin-film.

There still exists a need for a process that provides high-quality, crystalline, multinary-metal chalcogenide particles and films with tunable composition, size, and morphology. It is desirable to develop a low-cost, environmentally friendly process that is capable of producing these particles using water as the solvent. Processes for forming particles of compositions such as CTS and CZTS that are based upon abundant and non-toxic elements are of particular interest.

SUMMARY

Figure 1:
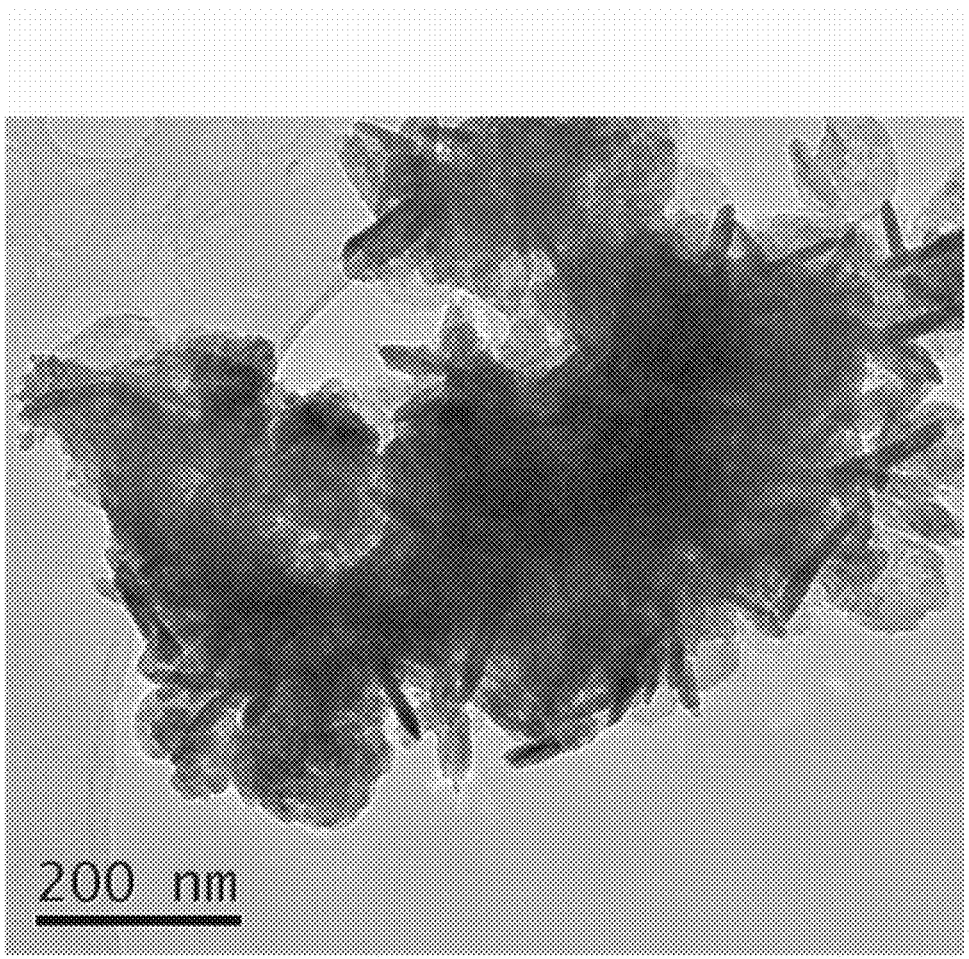
FIG. 1 depicts TEM images of as-synthesized copper chalcogenide nanoparticles prepared as in Example 1, before thermal treatment.
Figure 2:
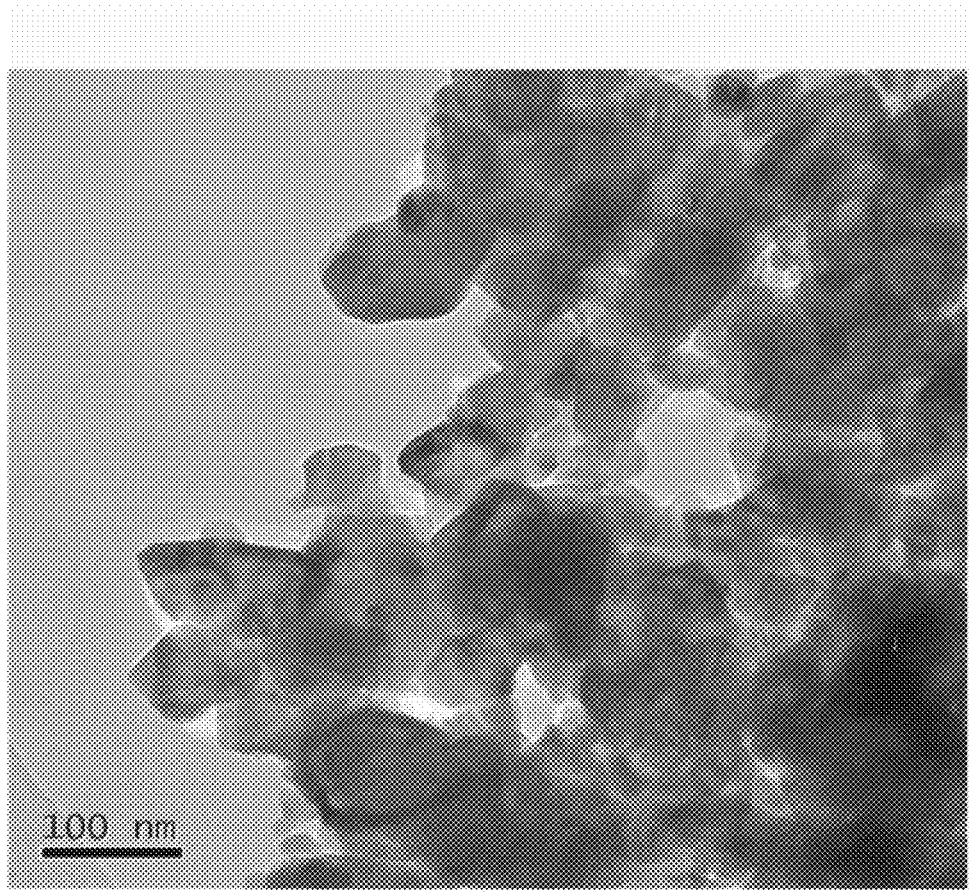
FIG. 2 depicts TEM images of crystalline copper zinc tin sulfide particles obtained via thermal treatment, as described in Example 2.
Figure 3:
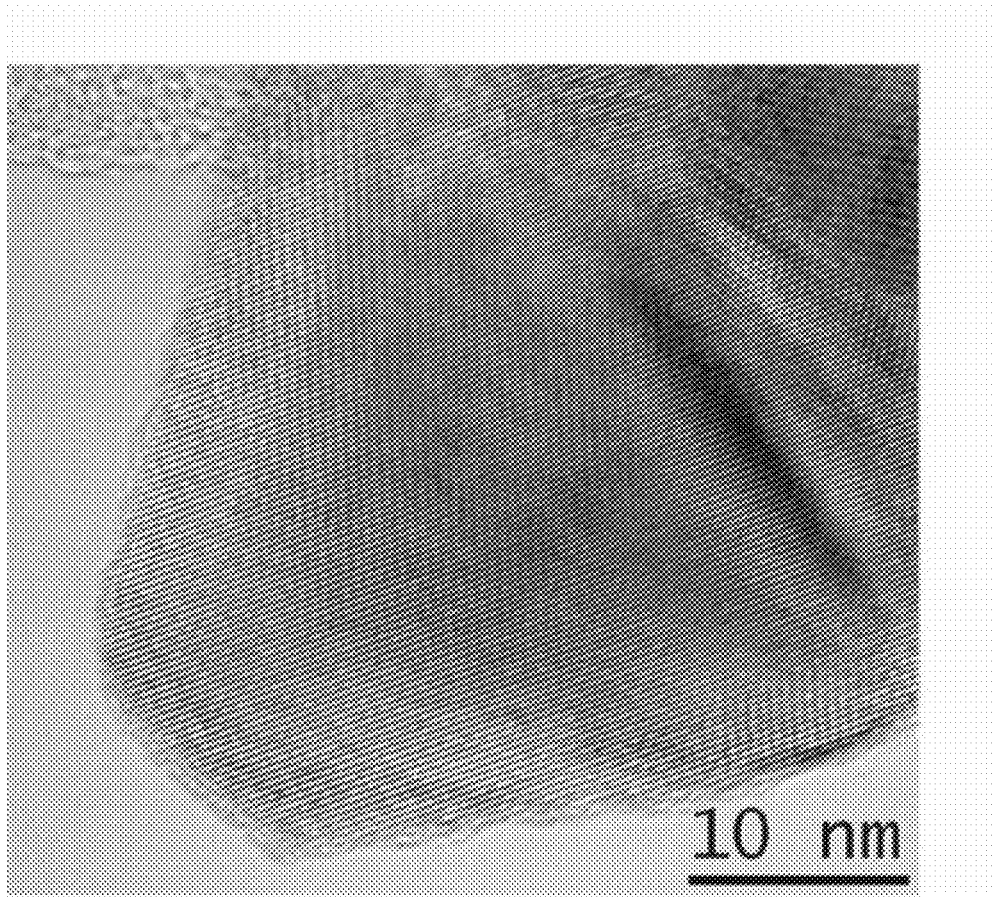
FIG. 3 depicts a detail of FIG. 2.
Figure 4:
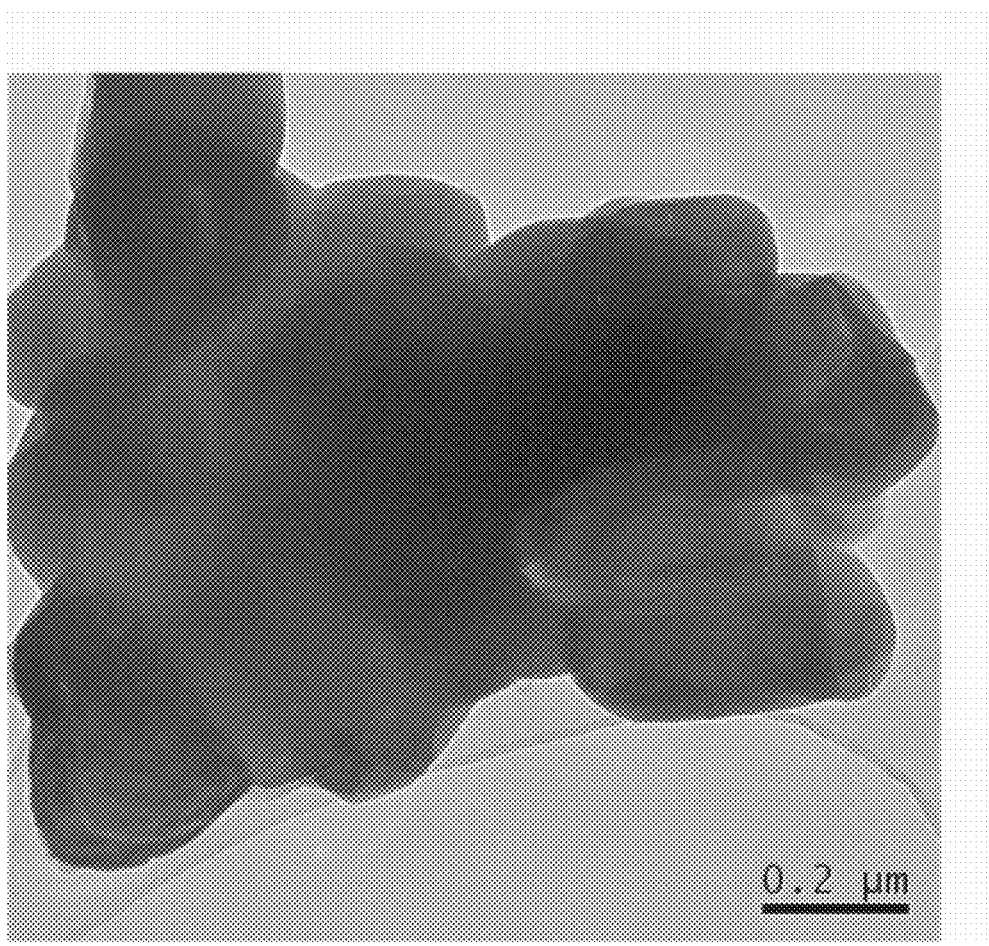
FIG. 4 depicts TEM images of crystalline copper zinc tin sulfide particles with a submicron-range average longest dimension obtained via thermal treatment, prepared as in Example 1B, Expt. 2.

One aspect of this invention provides an aqueous process for reacting a copper salt, a tin salt, optionally a zinc salt, one or more ligands, and a chalcogenide source to produce metal chalcogenide nanoparticles that are useful precursors to crystalline copper tin sulfide/selenide or crystalline copper zinc tin sulfide/selenide compositions.

Another aspect of this invention provides a process for producing crystalline multinary-metal chalcogenide particles from metal chalcogenide nanoparticles. The particles comprise a high percentage of a crystalline copper tin sulfide/selenide or crystalline copper zinc tin sulfide/selenide fraction.

DETAILED DESCRIPTION

Herein, the terms "solar cell" and "photovoltaic cell" are synonymous unless specifically defined otherwise. These terms refer to devices that use semiconductors to convert visible and near-visible light energy into usable electrical energy. The terms "band gap energy", "optical band gap", and "band gap" are synonymous unless specifically defined otherwise. These terms refer to the energy required to generate electron-hole pairs in a semiconductor material, which in general is the minimum energy needed to excite an electron from the valence band to the conduction band.

Herein, element groups are represented utilizing CAS notation. As used herein, the term "chalcogen" refers to Group VIA elements, and the terms "metal chalcogenides" or "chalcogenides" refer to materials that comprise metals and Group VIA elements. Suitable Group VIA elements include sulfur, selenium and tellurium. Metal chalcogenides are important candidate materials for photovoltaic applications, since many of these compounds have optical band gap values well within the terrestrial solar spectra.

Herein the term "binary-metal chalcogenide" refers to a chalcogenide composition comprising one metal. The term "ternary-metal chalcogenide" refers to a chalcogenide composition comprising two metals. The term "quaternary-metal chalcogenide" refers to a chalcogenide composition comprising three metals. The term "multinary-metal chalcogenide" refers to a chalcogenide composition comprising two or more metals and encompasses ternary and quaternary metal chalcogenide compositions.

Herein the term "single-formula crystalline multinary-metal chalcogenide" encompasses all possible combinations of the chalcogenides of sulfur, selenium and tellurium of a specific multinary-metal composition. For example, the formula $IB_2$-$IVA$-$VIA_3$ represents a single-formula crystalline multinary-metal chalcogenide that encompasses all possible combinations of $(Cu, Ag, Au)_2(C, Si, Ge, Sn, Pb)(S, Se, Te)_3$, including $Cu_2SnS_3$ and $(Cu,Ag)_2SnTe_3$. $(Cu,Ag)_2SnTe_3$ encompasses $Cu_2SnTe_3$, $Ag_2SnTe_3$, and $(Cu_xAg_{1-x})_2SnTe_3$, where $0 \leq x \leq 1$. The elements will be determined by the specific metal salts and chalcogen source(s) used in the reaction mixture for producing the metal chalcogenide nanoparticle precursor mixture. Fractional stoichiometries such as $(Cu, Ag, Au)_{1.80}(C, Si, Ge, Sn, Pb)_{1.05}(S, Se, Te)_3$ are further encompassed by this term. These materials can also contain small amounts of other elementals. This is illustrated more specifically below for copper tin sulfide/selenide and copper zinc tin sulfide/selenide.

Herein, the terms "copper tin sulfide" and "CTS" refer to $Cu_2SnS_3$; "copper tin selenide" and "CTSe" refer to $Cu_2SnSe_3$; and "copper tin sulfide/selenide" and "CTS/Se" encompass all possible combinations of $Cu_2Sn(S,Se)_3$, including $Cu_2SnS_3$, $Cu_2SnSe_3$, and $Cu_2SnS_xSe_{3-x}$, where $0 \leq x \leq 3$. The terms "copper tin sulfide", "copper tin selenide", "copper tin sulfide/selenide", "CTS", "CTSe" and "CTS/Se" further encompass fractional stoichiometries, e.g., $Cu_{1.80}Sn_{1.05}S_3$. That is, the stoichiometry of the elements can vary from a strictly 2:1:3 molar ratio.

Herein, the terms copper zinc tin sulfide and "CZTS" refer to $Cu_2ZnSnS_4$, copper zinc tin selenide and "CZTSe" refer to $Cu_2ZnSnSe_4$, and copper zinc tin sulfide/selenide and "CZTS/Se" encompass all possible combinations of $Cu_2ZnSn(S,Se)_4$, including $Cu_2ZnSnS_4$, $Cu_2ZnSnSe_4$, and $Cu_2ZnSnS_xSe_{4-x}$, where $0 \leq x \leq 4$. The terms "CZTS," "CZTSe," and "CZTS/Se" further encompass copper zinc tin sulfide/selenide semiconductors with fractional stoichiometries, e.g., $Cu_{1.94}Zn_{0.63}Sn_{1.3}S_4$. That is, the stoichiometry of the elements can vary from a strictly 2:1:1:4 molar ratio. Materials designated as CTS/Se and CZTS/Se may also contain small amounts of other elements such as sodium. CZTS crystallizes with a kesterite structure, and as used herein, the term "kesterite" refers to this crystal structure.

The term "nanoparticle" is meant to include chalcogenide-containing particles characterized by an average longest dimension of about 1 nm to about 1000 nm, or about 5 nm to about 500 nm, or about 10 nm to about 100 nm, or about 1 nm to about 200 nm, or about 1 nm to about 100 nm, or about 1 nm to about 50 nm, or about 1 nm to about 25 nm. Nanoparticles can possess various shapes, including polyhedra, spheres, rods, wires, tubes, flakes, whiskers, rings, disks, or prisms. Unless specified otherwise, nanoparticles can have a "surface coating" that can serve as a dispersing aid. The surface coating, that may also be referred to herein as a "capping group" or "capping agent", can be physically adsorbed to the nanoparticles or chemically bonded to the nanoparticles. This surface coating can also be the solvent or can comprise one or more ligands added to the reaction mixture. Methods for surface-coating inorganic nanoparticles are well-known in the art. Throughout the specification, all reference to wt % of nanoparticles is meant to include the surface coating.

Herein the terms "ink", "paste", and "dispersion" are synonymous, unless specifically defined as otherwise.

Metal Chalcogenide Nanoparticle Precursor Mixture

Described herein are processes for the preparation of crystalline multinary-metal chalcogenide compositions. The processes use commonly available precursors, operate at moderate temperatures and scalable concentrations, and allow for tuning of stoichiometry.

One aspect of this invention is a process comprising:
(a) providing a first aqueous solution comprising two or more metal salts and one or more ligands;
(b) optionally, adding a pH-modifying substance to form a second aqueous solution;
(c) combining the first or second aqueous solution with a chalcogen source to provide a reaction mixture; and
(d) agitating and optionally heating the reaction mixture to produce metal chalcogenide nanoparticles.

In one embodiment, the process further comprises separating the metal chalcogenide nanoparticles from the reaction mixture. In another embodiment, the process further comprises cleaning the surface of the nanoparticles. In another embodiment, the process further comprises reacting the surface of the nanoparticles with capping groups.

Metal Salts. Suitable metal salts comprise metals selected from the group consisting of Group VIII, IB, IIB, IIIA, IVA, and VA elements. In particular, suitable metal salts comprise metals selected from the group consisting of Cu, Ag, Zn, Cd, Al, Ga, In, Si, Ge, and Sn. The molar ratio of the metals in the desired crystalline multinary-metal chalcogenide composition provides guidance for determining the molar ratios of the metal salts. However, there is typically flexibility in the stoichiometry of the reactants, as a range in reactant stoichiometries can lead to the production of the same crystalline multinary-metal chalcogenide composition. For example, in the synthesis of nanoparticle mixtures that are precursors to crystalline $IB_2$-$IIB$-$IVA$-$VIA_4$ and $IB_2$-$IVA$-$VIA_3$ compositions, useful molar ratios include a metal-IB to metal-IVA of between about 0.4 and about 5, or between about 1 and about 3, or between about 1.5 and about 2.75. If metal-IIB is present, a molar ratio of metal-IB to metal-IIB is between about 0.4 and about 5, or between about 1 and about 3, and or between about 1.5 and about 2.75; and a molar ratio of metal-IIB to metal-IVA is between about 0.3 and about 5, or between about 0.5 and about 3, or between about 0.75 and about 2.

Suitable metal salts are water and/or acid-soluble. Solubility information regarding a wide range of metal salts is available in CRC *Handbook of Chemistry and Physics*, 90$^{th}$ Edition; Lide, David R., Ed; CRC Press: Florida, 2009-2010; Chapter 4; pp 43-101. The counterion of these metal salts can be ionically or covalently bonded to the metal. For example, useful counterions include halides, sulfate, nitrate, acetate, acetylacetonate, perchlorate, hypochlorite, cyanide, hydroxide, oxalate, and phosphate counterions.

Ligands.

While not wishing to be bound by theory, it is believed that the one or more ligands that are present in the reaction mixture play a role in complexing the metal salts and may also serve as dispersing agents or capping groups for the resulting metal chalcogenide nanoparticles. Suitable ligands include amines, thiols, selenols, organic acids, and ions thereof. In particular, suitable ligands include ammonia, mercaptoacetic acid, ethanolamine (EA), diethanolamine (DEA), triethanolamine (TEA), trimethanolamine (TMA), hexamethylenetetramine (HMT), ethylene diamine (ED), ethylenediamine tetraacetic acid (EDTA), nitrilotriacetate, and sodium citrate. Useful sources of ammonia include ammonium salts, e.g., ammonium nitrate. Ammonia (or an ammonium salt) can be used in combination with one or more additional ligands, such as mercaptoacetic acid, ethanolamine (EA), diethanolamine (DEA), triethanolamine (TEA), trimethanolamine (TMA), hexamethylenetetramine (HMT), ethylene diamine (ED), ethylenediamine tetraacetic acid (EDTA), nitrilotriacetate, and sodium citrate.

pH-Modifying Substance.

A pH-modifying substance can optionally be added to the reaction mixture to adjust the pH to between about 4 and about 0; or to between about 2 and about 0. Useful pH modifying substances are acids and bases. Suitable pH-modifying substances include protonic acids, e.g., sulfuric acid, nitric acid and hydrochloric acid. Alternatively, a pH-modifying substance can be used to adjust the pH to between about 10 and about 14; or to between about 12 and about 14. For this mode, suitable pH-modifying substances include bases.

Chalcogen Source.

While not wishing to be bound by theory, it is believed that the chalcogen or chalcogenide source used in the synthesis slowly generates sulfide or selenide ions in the reaction mixture. Suitable chalcogen sources include sulfide- and thione-containing compounds and their selenide and selenone counterparts. Thione- and selenone-containing compounds have the ability to release the chalcogenide under basic or acidic conditions. In particular, suitable chalcogen sources include sulfides and selenides of alkali metals, and thione- and selenone-containing compounds, e.g., sodium sulfide, sodium selenide, thioacetamide, selenoacetamide, thiourea and selenourea. The molar ratio of the chalcogen source to the total number of moles of the metal salts is at least about 1; or at least about 2; or at least about 4; or at least about 8.

Concentrations.

The preparation described herein for producing metal chalcogenide nanoparticles can be performed at relatively high concentrations. Useful concentrations of the combined metal salts in the reaction mixture are greater than about 0.01; or greater than about 0.02; or greater than about 0.03; or greater than about 0.04; or greater than about 0.05 molar.

Agitation and Heating.

Agitating and optionally heating the reaction mixture provides metal chalcogenide nanoparticles. Suitable heating temperatures are between about 40° C. and about 100° C., or between about 50° C. and about 100° C.; or between about 60 and about 90° C.; or between about 65 and about 85° C. Agitation can be achieved through standard methods, including stirring, sonication, and shaking. Useful heating times are from about 10 minutes up to about 48 h; or up to about 24 h; or up to about 12 h; or up to about 8 h; or up to about 4 h.

Separation from By-Products.

The resulting metal chalcogenide nanoparticles can be separated from reaction by-products to provide isolated metal chalcogenide nanoparticles. This separation can be achieved by standard means, including centrifugation, washing, solvent separation, filtration, and combinations thereof. A useful method of separation is centrifugation followed by washing. The particles can optionally be dried. A useful temperature range for drying is between about 20° C. and about 200° C. Suitable atmospheres for the drying process include an inert atmosphere, air, or vacuum.

Nanoparticle Characterization and Composition.

The metal chalcogenide nanoparticles are characterized by an average longest dimension of about 1 nm to about 1000 nm, or about 5 nm to about 500 nm, or about 10 nm to about 100 nm, or about 1 nm to about 200 nm, or about 1 nm to about 100 nm, or about 1 nm to about 50 nm, or about 1 nm to about 25 nm. The metal chalcogenide nanoparticles comprise two or more compositions selected from the group consisting of: binary metal chalcogenides of each metal and multinary-metal chalcogenides of each metal. For example, for reaction mixtures involving two metals, represented herein as metal1 and metal2, the resulting metal chalcogenide nanoparticles can comprise two or more compositions selected from the group consisting of: metal1 chalcogenide, metal2 chalcogenide, and metal1metal2 chalcogenide. For reaction mixtures involving three metals, represented herein as metal1, metal2 and metal3, the resulting metal chalcogenide nanoparticles can comprise two or more compositions selected from the group consisting of: metal1 chalcogenide, metal2 chalcogenide, metal3 chalcogenide, metal1metal2 chalcogenide, metal1metal3 chalcogenide, metal2metal3 chalcogenide, and metal1metal2metal3 chalcogenide. Similar descriptions hold for metal chalcogenide nanoparticle precursors to higher order multinary-metal chalcogenide compositions. A metal can be present in more than one oxidation state. Also, more than one chalcogenide can be present, such as a combination of sulfide and selenide.

Crystalline Multinary-Metal Chalcogenide Particles

Another aspect of the invention is a process comprising:
(a) providing a first aqueous solution comprising two or more metal salts and one or more ligands;
(b) optionally, adding a pH-modifying substance to form a second aqueous solution;
(c) combining the first or second aqueous solution with a chalcogen source to provide a reaction mixture;
(d) agitating and optionally heating the reaction mixture to produce metal chalcogenide nanoparticles;
(e) separating the metal chalcogenide nanoparticles from reaction by-products; and
(f) heating the metal chalcogenide nanoparticles to provide crystalline multinary-metal chalcogenide particles comprising, as based on the weight of the particles, about 80 wt % to 100 wt % of a single-formula crystalline multinary-metal chalcogenide fraction.

Another aspect of the invention relates to crystalline multinary-metal chalcogenide particles comprising, as based on the weight of the particles, about 80 wt % to 100 wt % of a single-formula crystalline multinary-metal chalcogenide fraction, wherein the crystalline multinary-metal particles are produced by a process comprising:
(a) providing a first aqueous solution comprising two or more metal salts and one or more ligands;
(b) optionally, adding a pH-modifying substance to form a second aqueous solution;
(c) combining the first or second aqueous solution with a chalcogen source to provide a reaction mixture;
(d) agitating and optionally heating the reaction mixture to produce metal chalcogenide nanoparticles;
(e) separating the metal chalcogenide nanoparticles from reaction by-products; and
(f) heating the metal chalcogenide nanoparticles to provide crystalline multinary-metal chalcogenide particles.

Descriptions and preferences regarding steps (a) through (e) and the compositions and components thereof are the same as listed above.

One embodiment further comprises cleaning the surface of the metal chalcogenide nanoparticles. Another embodiment further comprises reacting the surface of the metal chalcogenide nanoparticles with capping groups. Yet another embodiment comprises cleaning the surface of the crystalline multinary-metal chalcogenide particles. Another embodiment comprises reacting the surface of the crystalline multinary-metal chalcogenide particles with capping groups.

Heating.

In step (f), the metal chalcogenide nanoparticles are typically heated to a temperature between about 300° C. and about 800° C., or between about 350° C. and about 650° C., or between about 375° C. and about 525° C. to provide crystalline multinary-metal chalcogenide particles comprising, as based on the weight of the particles, about 80 wt % to 100 wt % of a single-formula crystalline multinary-metal chalcogenide fraction. The heating step serves to remove substantially all of any water and/or organic species present in the particles. The heating step also facilitates the formation of the single-formula crystalline multinary-metal chalcogenide fraction through the solid-state reaction of the metal chalcogenide nanoparticles.

The heating in step (f) can be achieved through standard methods known in the art including thermal processing. The heating may be carried out in an inert atmosphere, e.g., an atmosphere of $N_2$ or Ar gas. Alternatively, the atmosphere can further comprise a source of chalcogen. In one embodiment, the film is heated in a sulfur-rich environment, e.g., a sulfur/$N_2$ environment. For example, if the heating is carried out in a tube furnace, nitrogen can be used as a carrier gas, flowing over sulfur, to create a sulfur-rich atmosphere. In one embodiment, the film is heated in a selenium-rich environment, e.g., a Se/$N_2$ environment. For example, if the heating is carried out in a tube furnace, nitrogen can be used as a carrier gas, flowing over selenium, to create a selenium-rich atmosphere. In another embodiment, the film is heated in a hydrogen sulfide-rich atmosphere. For example, $H_2S$ and nitrogen mixed at a volume ratio of 1:9 to create a $H_2S$-rich atmosphere.

Composition.

The purity of the crystalline multinary-metal chalcogenide particles is high, as they are largely comprised of a single-formula crystalline multinary-metal chalcogenide fraction. If present, impurities comprise some amorphous compositions and small amounts of other crystalline fractions. For example, by TEM some particles have been observed to consist essentially of a crystalline fraction with a very thin layer of amorphous carbon on the surface. In various embodiments, the crystalline multinary-metal chalcogenide particles comprise, as based on the weight of the particles, about 80 wt % to 100 wt %; or about 85 wt % to 100 wt %; or about 90 wt % to 100 wt %; or about 95 wt % to 100 wt %; or about 98 wt % to 100 wt %; or about 99 wt % to 100 wt %; of a single-formula crystalline multinary-metal chalcogenide fraction. In some embodiments, the crystalline multinary-metal chalcogenide particles consist essentially of a single-formula crystalline multinary-metal chalcogenide fraction.

In various embodiments, the single-formula crystalline multinary-metal chalcogenide fraction comprises metals selected from the group consisting of Group VIII, IB, IIB, IIIA, IVA, and VA elements. In particular, suitable metal salts comprise metals selected from the group consisting of Cu, Ag, Zn, Cd, Al, Ga, In, Si, Ge, and Sn.

The crystalline multinary-metal chalcogenide particles comprise electrically, magnetically, catalytically and/or optically functional particles. The particles may be semiconducting; resistive; dielectric; conducting; light-producing; electron-producing; hole-producing; ferroelectric; thermoelectric, piezoelectric; ferritic; electro-optical; magnetic; light-absorbing, -reflecting, -diffracting, -scattering, -dispersing, -refracting, or -diffusing; and/or capable of modifying a refractive index. Catalytic, thermoelectric, semiconducting and conducting properties are of special interest. Single-formula crystalline multinary-metal chalcogenide of special interest include those selected from the group consisting of: crystalline IB-IIIA-VIA, IB-IIB-IVA-VIA and IB-IVA-VIA compositions, and crystalline IB-IIIA-VIA$_2$, IB$_2$-IB$_2$-IIB-VIA-VIA$_4$ and IB$_2$-IVA-VIA$_3$ compositions.

Characterization.

The crystalline multinary-metal chalcogenide particles are characterized by an average longest dimension of about 1 nm to about 10 microns; or about 1 nm to about 2000 nm; or about 1 nm to about 1000 nm; or about 1 nm to about 500 nm; or about 5 nm to about 400 nm; or about 5 nm to about 200 nm. This average longest dimension is often dependent upon the time that the metal chalcogenide nanoparticles are heated in step (f). Typically, longer heating times result in larger average longest dimensions. The crystalline multinary-metal chalcogenide particles are further characterized by a shape and aspect ratio. These particles are often characterized by a polyhedral shape with an aspect ratio less than about 4; or less than about 3; or less than about 2. In some embodiments, the crystalline multinary-metal chalcogenide particles are further characterized by a size distribution of about 1 nm to about 2000 nm; or about 1 nm to about 1000 nm; or about 1 nm to about 500 nm; or about 5 nm to about 400 nm; or about 5 nm to about 200 nm.

Another embodiment further comprises combining the crystalline multinary-metal chalcogenide particles with a fluid medium to provide an ink.

Inks of Metal Chalcogenide Nanoparticles and of Multinary-Metal Particles

Another aspect of the invention relates to an ink comprising:

(1) about 2 wt % to about 80 wt % of crystalline multinary-metal chalcogenide particles comprising, as based on the weight of the particles, about 80 wt % to 100 wt % of a single-formula crystalline multinary-metal chalcogenide fraction, wherein the crystalline particles are produced by a process comprising:
   (a) providing a first aqueous solution comprising two or more metal salts and one or more ligands;
   (b) optionally, adding a pH-modifying substance to form a second aqueous solution;
   (c) combining the first or second aqueous solution with a chalcogen source to provide a reaction mixture;
   (d) agitating and optionally heating the reaction mixture to produce metal chalcogenide nanoparticles;
   (e) separating the metal chalcogenide nanoparticles from reaction by-products; and
   (f) heating the metal chalcogenide nanoparticles to provide crystalline multinary-metal chalcogenide particles comprising; and (2) about 20 to about 98 wt % of a fluid medium.

Descriptions regarding steps (a) through (f) and the compositions and components thereof are the same as listed above.

One embodiment further comprises cleaning the surface of the metal chalcogenide nanoparticles. Another embodiment further comprises reacting the surface of the metal chalcogenide nanoparticles with capping groups. Yet another embodiment comprises cleaning the surface of the crystalline multinary-metal chalcogenide particles. Another embodiment comprises reacting the surface of the crystalline multinary-metal chalcogenide particles with capping groups.

Another embodiment of the present invention comprises combining the metal chalcogenide nanoparticles with a fluid medium to provide an ink. Yet another embodiment of the present invention comprises combining the crystalline multinary-metal chalcogenide particles with a fluid medium to provide an ink.

Fluid Medium.

The fluid medium serves as the carrier vehicle for the metal chalcogenide nanoparticles and/or the crystalline multinary-metal chalcogenide particles. The ink comprises about 2 wt % to about 80 wt %; or about 5 wt % to about 50 wt %; or about 5 wt % to about 30 wt %; or about 5 to about 20 wt % of the metal chalcogenide nanoparticles and/or crystalline multinary-metal chalcogenide particles, and about 20 to about 98 wt %; or about 50 wt % to about 95 wt %; or about 70 wt % to about 95 wt %; or about 80 wt % to about 95 wt % of a fluid medium.

The fluid medium comprises one or more liquids selected from the group consisting of: water, aromatics, heteroaromatics, alkanes, nitriles, ethers, ketones, esters, acetates, amides, amines, thiols, carboxylic acids, organic halides, and alcohols. Suitable liquids include water, toluene, xylenes, mesitylene, pyridine, 2-picoline, 3-picoline, 3,5-lutidine, 5-t-butylpyridine, hexane, heptane, octane, cyclohexane, 2,2,4-trimethylpentane, acetonitrile, 3-methoxypropionitrile, dimethoxyethane, ethylene glycol diethyl ether, tetrahydrofuran, acetone, 2-pentanone, cyclopentanone, cyclohexanone, ethyl acetate, butyl acetate, dimethylformamide, N-methylpyrrolidone, tetramethylethylenediamine, 3-methoxypropylamine, dimethylaminoethanol, oleylamine, triethylamine, 1-octanethiol, 1-decanethiol, 1-dodecanethiol, mercaptoethanol, thioglycolic acid, oleic acid, dichloromethane, chloroform, chlorobenzene, 1,2-dichlorobenzene, methanol, ethanol, isopropanol, n-propanol, 2-methoxyethanol, 2-ethoxyethanol, 2-butoxyethanol, monoterpene alcohol (alpha-, beta-terpineol, or combination of isomers alpha, beta, and gamma-terpineol) and 2,2,4-trimethyl-1,3-pentanediol monoisobutyrate (Texanol).

Compounds such pyridine, 2-picoline, 3-picoline, 3,5-lutidine, 5-t-butylpyridine, acetonitrile, 3-methoxypropionitrile, tetramethylethylenediamine, 3-methoxypropylamine, dimethylaminoethanol, oleylamine, triethylamine, 1-octanethiol, 1-decanethiol, 1-dodecanethiol, mercaptoethanol, thioglycolic acid, oleic acid, 2-methoxyethanol, 2-ethoxyethanol, 2-butoxyethanol, and 2,2,4-trimethyl-1,3-pentanediol monoisobutyrate (Texanol) can serve as dispersants or capping groups, as well as being the carrier vehicle for the particles.

Additives.

The ink may further comprise up to about 20 wt %; or up to about 10 wt %; or up to about 5 wt %; or up to about 2 wt %; or up to about 1 wt % of one or more additive(s) comprising dispersants, surfactants, binders, cross-linking agents, emulsifiers, anti-foaming agents, plasticizers, dryers, fillers, extenders, thickening agents, film conditioners, anti-oxidants, flow agents, leveling agents, ligands, capping groups, elemental chalcogen, dopants, and corrosion inhibitors.

Suitable binders include polymers and oligomers with linear, branched, comb/brush, star, hyperbranched or dendritic structures and those with decomposition temperatures below about 400° C.; or about 350° C.; or about 250° C.; or about 200° C. Suitable polymers and oligomers include homo- and co-polymers of polyethers; polylactides; polycarbonates; poly[3-hydroxybutyric acid]; polymethacrylates; poly(meth-acrylic) copolymers; poly(methacrylic acid); poly(ethylene glycol); poly(lactic acid); poly(DL-lactide/glycolide); poly(propylene carbonate); and poly(ethylene carbonate). If present, the polymeric or oligomeric binder is less than 20 wt %, or less than 10 wt %, or less than 5 wt %, or less than 2 wt %, or less than 1 wt % of the ink.

Suitable surfactants include siloxy-, fluoryl-, alkyl-, and alkynyl-substituted surfactants. Selection is typically based on observed coating and dispersion quality and the desired adhesion to the substrate. Suitable surfactants include Byk® (Byk Chemie), Zonyl® (DuPont), Triton® (Dow), Surynol® (Air Products), and Dynol® (Air Products) surfactants.

Suitable dopants include metal cations (e.g., sodium ions) and binary semiconductors. If present, the dopants are typically between 0.1 wt % and 10 wt % of the ink.

If present, the elemental chalcogen additive is typically between 0.1 wt % and 10 wt % of the ink.

Suitable ligands are selected from those listed above. Suitable dispersants include polyvinylpyrrolidone, polycarboxylates, polyphosphates, polyamines, polyethylene glycol, and peptides comprising cysteine and/or histidine residues. Suitable capping groups include phosphine oxides; amines; thiols; selenols; organic acids, and ions thereof.

Layers of Nanoparticles and of Crystalline Particles

One aspect of this invention is a process comprising:

(a) providing a first aqueous solution comprising two or more metal salts and one or more ligands;

(b) optionally, adding a pH-modifying substance to form a second aqueous solution;

(c) combining the first or second aqueous solution with a chalcogen source to provide a reaction mixture;

(d) agitating and optionally heating the reaction mixture to produce metal chalcogenide nanoparticles;

(e) separating the metal chalcogenide nanoparticles from reaction by-products;

(f) optionally, combining the metal chalcogenide nanoparticles with a fluid medium to provide an ink;

(g) depositing the metal chalcogenide nanoparticles on a substrate to provide a metal chalcogenide nanoparticle layer on the substrate; and (h) annealing the metal chalcogenide nanoparticle layer to provide a crystalline multinary-metal chalcogenide layer.

Another aspect of this invention is a multilayer structure comprising in layered sequence:

(1) a base film;

(2) optionally, an electrically conductive coating; and (3) a film comprising one or more layer(s), wherein the one or more layer(s) comprise about 80 wt % to 100 wt %, as based on the weight of the layer, of a single-formula crystalline multinary-metal chalcogenide fraction that is prepared by a process comprising:

(a) providing a first aqueous solution comprising two or more metal salts and one or more ligands;

(b) optionally, adding a pH-modifying substance to form a second aqueous solution;

(c) combining the first or second aqueous solution with a chalcogen source to provide a reaction mixture;

(d) agitating and optionally heating the reaction mixture to produce metal chalcogenide nanoparticles;

(e) separating the metal chalcogenide nanoparticles from reaction by-products;

(f) optionally, combining the metal chalcogenide nanoparticles with a fluid medium to provide an ink;

(g) depositing the metal chalcogenide nanoparticles on a substrate to provide a metal chalcogenide nanoparticle layer on the substrate; and (h) annealing the metal chalcogenide nanoparticle layer.

Descriptions regarding steps (a) through (f) and the compositions and components thereof are the same as listed above.

One embodiment further comprises cleaning the surface of the metal chalcogenide nanoparticles. Another embodiment further comprises reacting the surface of the metal chalcogenide nanoparticles with capping groups. Yet another embodiment comprises cleaning the surface of the crystalline multinary-metal chalcogenide particles. Another embodiment comprises reacting the surface of the crystalline multinary-metal chalcogenide particles with capping groups. Another embodiment comprises cleaning the surface of the metal chalcogenide nanoparticle layer.

Although the metal chalcogenide nanoparticles can be deposited as a powder on a surface, for purposes of forming thin films of uniform thickness, a preferred mode is to combine the metal chalcogenide nanoparticles with a fluid medium to provide an ink as in step (f).

Another embodiment of this invention is a process comprising:
(a) depositing the ink of crystalline multinary-metal chalcogenide particles on a substrate; and
(b) removing the fluid medium to provide a particle-coated substrate; wherein the substrate comprises in layered sequence:
  (i) a base film; and
  (ii) optionally, an electrically conductive coating.

In one embodiment, this process further comprises heating the particle-coated substrate to provide a substrate with an annealed coating, wherein the annealed coating consists essentially of a crystalline single-formula multinary-metal chalcogenide fraction.

Deposition.

The inks of metal chalcogenide nanoparticles and of crystalline multinary-metal chalcogenide particles are deposited on a surface of a substrate by any of several conventional coating techniques, e.g., spin-coating, doctor blade coating, spraying, dip-coating, rod-coating, drop-cast coating, wet coating, printing, roller coating, slot-die coating, meyerbar coating, capillary coating, ink-jet printing, or draw-down coating. At concentrations of solids above about 30 wt %, the viscosity and the rheological properties of the dispersion (ink) are paste-like. Therefore, paste-coating methods such as screen-printing can be utilized. The fluid medium can be removed by drying in air or vacuum to form a coated substrate. The drying step can be a separate, distinct step, or can occur as the substrate and precursor ink are heated in an annealing step.

Substrate.

The substrate can be rigid or flexible. In one embodiment, the substrate comprises in layered sequence: (i) a base film; and (ii) optionally, an electrically conductive coating. The base film is selected from the group consisting of: glass, metals, and polymeric films. Suitable electrically conductive coatings include: metal conductors, transparent conducting oxides, and organic conductors. Of particular interest are substrates of molybdenum-coated soda-lime glass, molybdenum-coated polyimide films, or molybdenum-coated polyimide films with a thin layer of a sodium compound (e.g., NaF, $Na_2S$, or $Na_2Se$). Other suitable substrates include solar glass, low-iron glass, green glass, steel, stainless steel, aluminum, ceramics, metalized ceramic plates, metalized polymer plates, and metalized glass plates.

Annealing.

The metal chalcogenide nanoparticle layer(s) and crystalline multinary-metal chalcogenide particle layer(s) are annealed to provide a crystalline multinary-metal chalcogenide layer comprising, as based on the weight of the layer, about 80 wt % to 100 wt % of a single-formula crystalline multinary-metal chalcogenide fraction. A layer of nanoparticles typically heats into a solid layer at lower temperatures than a corresponding layer of microparticles. This is due, in part, to the greater surface area contact between particles. In some embodiments, the coated substrate is heated at a temperature between about 300° C. and about 800° C., or between about 350° C. and about 650° C., or between about 375° C. and about 525° C. to obtain a crystalline multinary-metal chalcogenide layer on the substrate. The annealing step serves to remove substantially all of any water and/or organic species present in the layer. The annealing step also facilitates the formation of a crystalline multinary-metal chalcogenide thin film through the solid-state reaction of the metal chalcogenide nanoparticles.

The annealing step can include thermal processing, pulsed thermal processing, laser beam exposure, heating via IR lamps, electron beam exposure, and combinations thereof. The annealing temperature can be modulated to oscillate within a temperature range without being maintained at a particular plateau temperature. This technique is sometimes referred to a "rapid thermal annealing" or "RTA."

The annealing can be carried out in an inert atmosphere, e.g., an atmosphere of $N_2$ or Ar gas. Alternatively, the atmosphere can further comprise a source of chalcogen.

In one embodiment, multiple cycles of coating with the metal chalcogenide nanoparticle precursor ink and annealing are carried out to form a thicker crystalline multinary-metal chalcogenide layer on the substrate.

Film Thickness.

The annealed film typically has an increased density and/or reduced thickness versus that of the wet precursor layer, since the fluid medium and other organic materials have been removed during processing. In one embodiment, the film is between about 0.1 microns and about 5 microns, or between about 0.3 microns and about 3 microns, or between about 0.5 microns and about 2 microns thick.

Composition.

The purity of the crystalline multinary-metal chalcogenide layer(s) is high, as it is largely comprised of a single-formula crystalline multinary-metal chalcogenide fraction. If present, impurities comprise some amorphous compositions and small amounts of other crystalline fractions. Composition may be determined by various analytical techniques, including XRD, XAFS, and ESCA. In various embodiments, the composition of the crystalline multinary-metal chalcogenide layer comprises, as based on the weight of the layer, about 80 wt % to 100 wt %; or about 85 wt % to 100 wt %; or about 90 wt % to 100 wt %; or about 95 wt % to 100 wt %; or about 99 wt % to 100 wt %; of a single-formula crystalline multinary-metal chalcogenide fraction. In another embodiment, the crystalline multinary-metal chalcogenide layer consists essentially of a single-formula crystalline multinary-metal chalcogenide fraction.

In various embodiments, the single-formula crystalline multinary-metal chalcogenide fraction comprises metals selected from the group consisting of: Group VIII, IB, IIB, IIIA, IVA, and VA elements. Suitable metals for the single-formula crystalline multinary-metal chalcogenide fraction include Cu, Ag, Zn, Cd, Al, Ga, In, Si, Ge, and Sn.

The crystalline multinary-metal chalcogenide layer(s) comprise an electrically, magnetically, catalytically or optically functional crystalline multinary-metal chalcogenide fraction, including semiconducting; resistive; dielectric; conducting; light-producing; electron-producing; hole-producing; ferroelectric; thermoelectric, piezoelectric; ferritic; electro-optical; magnetic; light-absorbing, -reflecting, -diffracting, -scattering, -dispersing, -refracting, or -diffusing; and refractive index modifying crystalline multinary-metal chalcogenide fractions. In semiconducting and conducting fractions, the single-formula crystalline multinary-metal chalcogenide fraction is selected from the group consisting of crystalline IB-IIIA-VIA, IB-IIB-IVA-VIA and IB-IVA-VIA compositions, including the group of crystalline IB-IIIA-VIA$_2$, IB$_2$-IIB-IVA-VIA$_4$ and IB$_2$-IVA-VIA$_3$ compositions.

Surface Cleaning and Capping Groups

Surface Cleaning.

In some embodiments, the surfaces of the metal chalcogenide nanoparticles, the crystalline multinary chalcogenide particles, and/or the crystalline multinary chalcogenide layers are cleaned. Suitable cleaning reagents include water; hydrogen peroxide; acids; bases; thione- and selenone-containing compounds; solutions thereof; and mixtures thereof. Specific examples include deionized water; sodium hydroxide; hydrogen peroxide; thiourea; and thioacetamide. Diluted solutions of these reagents can also be used. Suitable cleaning methods include soaking or washing. For example, the nanoparticles, particles, and layers can be soaked in a 5% solution of thiourea for 30 minutes; or in a solution of 1 g of sodium hydroxide in 1 mL of 30% hydrogen peroxide and 40 mL of water for 1 minute.

Capping Groups.

In same embodiments, the surfaces of the metal chalcogenide nanoparticles and the surfaces of the crystalline multinary-metal chalcogenide particles are reacted with a capping group. This process can be used for a number of purposes. The capping groups can replace ligands and by-products of the reaction from the nanoparticle and particle surfaces. The capping group can act as a dispersion promoter and enable the use of a variety of fluid media in the inks. Volatile capping groups offer additional advantages, since they volatilize rather than decompose, thereby avoiding the introduction of substantial impurities (e.g., carbon) into products produced through heating of the nanoparticles and particles coated with capping groups. Although such impurities are not necessarily fatal to performance, they can, for example, degrade the electronic properties of a semiconductor film. In contrast, volatile capping agents volatilize away, thereby creating products of higher purity.

Suitable capping groups include: phosphine oxides; amines; thiols; selenols; organic acids; and ions thereof. More specifically, suitable capping groups include alkyl amines, alkyl thiols, trialkylphosphine oxides, trialkylphosphines, alkylphosphonic acids, pyridine, alkylpyridines, ethanolamines, citrates, thioglycolic acid, and oleic acid.

An advantage of the processes described herein is that the relatively low reaction temperatures used for synthesizing the metal chalcogenide nanoparticles enable the incorporation of ligands with relatively high volatility on the surface of the nanoparticles during their synthesis. These ligands serve as capping groups. Alternatively, capping groups with even higher volatility can be incorporated through ligand exchange. In one embodiment, the wet nanoparticle pellet stabilized by ligand that was incorporated during synthesis is suspended in a volatile capping agent to produce a colloidal suspension. Separation of the metal chalcogenide nanoparticles from the suspension separates the nanoparticles from the ligand to produce metal chalcogenide nanoparticles with volatile capping groups. Crystalline multinary-metal chalcogenide particles with capping groups can be produced in a similar manner.

In another embodiment, the exchange of capping agents occurs following film formation. The unannealed film is soaked in a volatile capping agent, which then exchanges with the less volatile ligand or capping group of the metal chalcogenide nanoparticles or crystalline multinary-metal chalcogenide particles. The non-volatile capping agent is then removed along with the excess volatile capping agent. Advantages of this method include improved film densification and lower levels of carbon-based impurities in the annealed film.

The "volatile capping agent" used in the present invention can be any capping agent (also sometimes referred to as stabilizing agent) known in the art which is sufficiently volatile such that, instead of decomposing and introducing impurities into the film, it volatilizes during film deposition. As used herein, the term "volatile" is defined as having a boiling point less than about 200° C. at ambient pressure, or less than about 150° C., or less than about 120° C., or less than about 100° C. The purpose of the capping agent is to prevent interaction and agglomeration of the nanoparticles, thereby maintaining a uniform distribution of the colloidal substance (metal chalcogenide nanoparticles or crystalline metal chalcogenide particles), the disperse phase, throughout the dispersion medium. Volatile capping agents suitable for use in the present invention are volatile compounds that contain at least one electron pair-donor group or a group which can be converted into such an electron pair-donor group. The electron pair-donor group can be electrically neutral or negative, and usually contains atoms such as O, N, P or S. Specific examples of suitable volatile capping agents include ammonia, methyl amine, ethyl amine, butylamine, tetramethylethylene diamine, acetonitrile, butanol, pyridine, ethanethiol, tetrahydrofuran, and diethyl ether.

Preparation of Devices, Including Thin-Film Photovoltaic Cells

Various electrical elements that can be formed, at least in part, by the use of the materials described herein include electronic circuitry, resistors, capacitors, diodes, rectifiers, electroluminescent lamps, memory elements, field effect transistors, bipolar transistors, unijunction transistors, thin film transistors, metal-insulator-semiconductor stacks, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, and cut-off filters), mirrors, splitters, couplers, combiners, modulators, sensors (e.g., evanescent sensors, phase modulation sensors, and interferometric sensors), optical cavities, piezo-electric devices, ferroelectric devices, thin film batteries, and photovoltaic devices. Combinations can also be useful, for example, the combination of field effect transistors and organic electroluminescent lamps as an active matrix array for an optical display.

A typical photovoltaic cell includes a substrate, a back contact layer (e.g., molybdenum), an absorber layer (also referred to as the first semiconductor layer), a buffer layer (also referred to as the second semiconductor layer), and a top contact layer. The photovoltaic cell can also include an electrical contact of electrode pad on the top contact layer, and an anti-reflective (AR) coating on the front (light-facing) surface of the substrate to enhance the transmission of light into the semiconductor layer.

One aspect of the present invention is a process comprising depositing one or more layer(s) in layered sequence onto the annealed crystalline multinary-metal chalcogenide coating of the substrate. The layer(s) can be selected from the group consisting of: conductors, semiconductors, and dielectrics. In one embodiment, the process provides a photovoltaic device and comprises depositing the following layers in layered sequence onto the annealed coating of the substrate having an electrically conductive layer present: (i) a buffer layer; (ii) a transparent top contact layer, and (iii) optionally, an antireflective layer.

Another aspect of the present invention is a device made by the process comprising depositing one or more layer(s) in layered sequence onto the annealed crystalline multinary-metal chalcogenide coating of the substrate.

Suitable substrate materials for the photovoltaic cell substrate are as described above and below. The photovoltaic cell substrate can also comprise an interfacial layer to promote adhesion between the substrate material and metal layer. Suitable interfacial layers can comprise metals (e.g., V, W, Cr), glass, or compounds of nitrides, oxides, and/or carbides.

Typical photovoltaic cell substrates are glass or plastic, coated on one side with a conductive material, e.g., a metal. In one embodiment, the substrate is molybdenum-coated glass.

Depositing and annealing the crystalline multinary-metal chalcogenide layer on the photovoltaic cell substrate to form an absorber layer can be carried out as described above. A suitable crystalline multinary-metal chalcogenide layer for a photovoltaic cell comprises a single-formula crystalline multinary-metal chalcogenide fraction that is selected from the group consisting of: crystalline IB-IIIA-VIA and IB-IIB-IVA-VIA compositions or crystalline IB-IIIA-VIA$_2$ and IB$_2$-IIB-IVA-VIA$_4$ compositions. Preferred compositions include $Cu_2(In,Ga)(S,Se)_2$ and $Cu_2ZnSn(S,Se)_4$.

The buffer layer typically comprises an inorganic material such as CdS, ZnS, zinc hydroxide, Zn (S, O, OH), cadmium zinc sulfides, In(OH)$_3$, In$_2$S$_3$, ZnSe, zinc indium selenides, indium selenides, zinc magnesium oxides, or n-type organic materials, or combinations thereof. Layers of these materials can be deposited by chemical bath deposition, atomic layer deposition, coevaporation, sputtering or chemical surface deposition to a thickness of about 2 nm to about 1000 nm, or from about 5 nm to about 500 nm, or from about 10 nm to about 300 nm, or 40 nm to 100 nm, or 50 nm to 80 nm.

The top contact layer is typically a transparent conducting oxide, e.g., zinc oxide, aluminum-doped zinc oxide, indium tin oxide, or cadmium stannate. Suitable deposition techniques include sputtering, evaporation, chemical bath deposition, electroplating, chemical vapor deposition, physical vapor deposition, and atomic layer deposition. Alternatively, the top contact layer can comprise a transparent conductive polymeric layer, e.g., poly-3,4-ethylenedioxythiophene (PEDOT) doped with poly(styrenesulfonate) (PSS), which can be deposited by standard methods, including spin coating, dip-coating or spray coating. In some embodiments, the PEDOT is treated to remove acidic components to reduce the potential of acid-induced degradation of the photovoltaic cell components.

In one embodiment, the photovoltaic cell substrate coated with a crystalline multinary-metal chalcogenide film is placed in a cadmium sulfide bath to deposit a layer of CdS. Alternatively, CdS can be deposited on the crystalline multinary-metal chalcogenide film by placing the coated substrate in a cadmium iodide bath containing thiourea.

In one embodiment, the photovoltaic cell is fabricated using a sputtered layer of insulating zinc oxide in place of CdS. In some embodiments, CdS and ZnO layers are both present in the photovoltaic cell; in other embodiments, only one of CdS and ZnO is present.

In some embodiments, a layer of a sodium compound (e.g., NaF, Na$_2$S, or Na$_2$Se) is formed above and/or below the crystalline multinary-metal chalcogenide layer. The layer of the sodium compound can be applied by sputtering, evaporation, chemical bath deposition, electroplating, sol-gel based coatings, spray coating, chemical vapor deposition, physical vapor deposition, or atomic layer deposition.

Characterization

Useful analytical techniques for characterizing the composition, size, size distribution, density, and crystallinity of the metal chalcogenide nanoparticles, crystalline multinary-metal chalcogenide particles and layers of the present invention include XRD, XAFS, EDAX, ICP-MS, DLS, AFM, SEM, ESC, and SAX.

The following is a list of abbreviations and trade names used above and in the Examples:

| Abbreviation | Description |
| --- | --- |
| XRD | X-Ray Diffraction |
| FWHM | Full Width at Half Maximum |
| TEM | Transmission Electron Microscopy |
| ICP-MS | Inductively Coupled Plasma Mass Spectrometry |
| AFM | Atomic Force Microscopy |
| DLS | Dynamic Light Scattering |
| SEM | Scanning Electron Microscopy |
| SAX | Small Angle X-ray Scattering |
| EDX | Energy-Dispersive X-ray Spectroscopy |
| XAFS | X-Ray absorption fine structure |
| CIGS | Copper-Indium-Gallium-Sulfo-di-selenide |
| CZTS | Copper Zinc Tin Sulfide ($Cu_2ZnSnS_4$) |
| CZTSe | Copper Zinc Tin Selenide ($Cu_2ZnSnSe_4$) |
| CZTS/Se | All possible combinations of CZTS and CZTSe |
| CTS | Copper Tin Sulfide ($Cu_2SnS_3$) |
| CTSe | Copper Tin Selenide ($Cu_2SnSe_3$) |
| CTS/Se | All possible combinations of CTS and CTSe |
| Deg | Degree |
| FW | Formula Weight |
| Ex | Example |
| RTA | Rapid Thermal Annealing |
| EA | Ethanolamine |
| DEA | Diethanolamine |
| TEA | Triethanolamine |
| TMA | Trimethanolamine |
| HMT | Hexamethylenetetramine |
| ED | Ethylene diamine |
| EDTA | Ethylenediamine tetraacetic acid |

EXAMPLES

Materials

Copper sulfate (CuSO$_4$), indium chloride (InCl$_3$), zinc sulfate heptahydrate (ZnSO$_4$.7H$_2$O), tin(IV) chloride pentahydrate (SnCl$_4$.5H$_2$O), thioacetamide (CH$_3$CSNH$_2$, TAA), triethanolamine (C$_6$H$_{15}$NO$_3$, TEA), thiourea ((NH$_2$)$_2$CS), ammonium nitrate (NH$_4$NO$_3$), sulfuric acid (H$_2$SO$_4$), trisodium citrate (C$_6$H$_8$O$_7$Na$_3$.2H$_2$O), ammonium hydroxide (NH$_4$OH, sodium hydroxide (NaOH) and polyvinylpyrrolidone (MW 30,000) were purchased from Sigma-Aldrich Co. (St. Louis, Mo.). These chemicals were used without further purification. Nanopure water was used for all experiments.

Annealing of Coated Substrates in a Tube Furnace.

Annealings were carried out either under an inert atmosphere (nitrogen or argon) or under an inert atmosphere comprising sulfur. Annealings under an inert atmosphere were carried out in either a single-zone Lindberg/Blue (Ashville, N.C.) tube furnace equipped with an external temperature controller and a one-inch quartz tube, or in a Lindberg/Blue three-zone tube furnace (Model STF55346C) equipped with a three-inch quartz tube. A gas inlet and outlet were located at opposite ends of the tube, and the tube was purged with the inert gas while heating and cooling. The coated substrates were placed on quartz plates or boats inside of the tube.

Annealings under a sulfur atmosphere were carried out in the single-zone furnace in the one-inch tube. A 3-inch long ceramic boat was loaded with 2.5 g of elemental sulfur and placed near the nitrogen inlet, outside of the direct heating zone. The coated substrates were placed on quartz plates inside the tube.

XAS Analysis.

XANES spectroscopy at the Cu, Zn and Sn K-edges were carried out at the Advanced Photon Source at the Argonne National Laboratory. Data were collected in fluorescence geometry at beamline 5BMD, DND-CAT. Thin film samples were presented to the incident x-ray beam as made. An Oxford spectroscopy-grade ion chamber was used to determine the X-ray incident intensity ($I_0$). The $I_0$ detector was filled with 570 Torr of $N_2$ and 20 Torr of Ar. The fluorescence detector was a Lytle Cell filled with Xe installed perpendicular to the beam propagation direction. Data were collected from 8879 eV to 9954 eV for the Cu edge. The high final energy was used in order to capture a portion of the Zn edge in the same data set, to allow edge step ratio determination as an estimate of Cu:Zn ratio in the film. The Zn edge data were collected over the range 9557 eV to 10,404 eV. Sn edge data covered the range of 29,000 eV to 29,750 eV. The data energy scales were calibrated based on data from metal reference foils collected prior to sample data collection. A second order background was subtracted and the spectra were normalized. Data from several Cu, Zn and Sn sulfide and oxide standards ($Cu_2ZnSnS_4$, $Cu_2SnS_3$, CuS, $Cu_2S$, CuO, $Cu_2O$, ZnS, ZnO, SnS, SnO and $SnO_2$) were obtained under the same conditions. Non-linear least squares fitting of a linear combination of the appropriate standards to the spectra obtained from the samples yielded the phase distribution for each element.

XRD Analysis.

Powder X-ray diffraction was used for the identification of crystalline phases. Data were obtained with a Philips X'PERT automated powder diffractometer, Model 3040. The diffractometer was equipped with automatic variable anti-scatter and divergence slits, X'Celerator RTMS detector, and Ni filter. The radiation was CuK(alpha) (45 kV, 40 mA). Data were collected at room temperature from 4 to 120°. 2-theta; using a continuous scan with an equivalent step size of 0.02°; and a count time of from 80 sec to 240 sec per step in theta-theta geometry. Thin film samples were presented to the X-ray beam as made. MDI/Jade software version 9.1 was used with the International Committee for Diffraction Data database PDF4+ 2008 for phase identification and data analysis.

Particle Size Distribution (PSD).

The PSD was measured with a Beckman Coulter LS13320 using laser diffraction to determine the volume distribution of a field of particles. An aliquot of the powder (~0.1 g) was mixed 1 drop of surfynol (a surfactant to promote wetting) and 20 mL of deionized water and sonified by ultrasonic probe for one minute. A portion of this was added to the instrument which was also filled with deionized water. Two repeat runs were made as a check on sample stability and on instrument reproducibility SAXS Analysis.

Determination of particle sizes and distributions by SAXS was carried out using a USAXS double crystal, Bonse-Hart, from Rigaku. Samples were analyzed as a single layer (~50 μm thick) of crystallites on sticky tape. Desmearing and analysis were conducted as contained in a standard package for IGOR.

Synthesis of CZTS Crystals.

Copper(II) sulfide (4.35 g, 0.0455 mol), zinc(II) sulfide (2.22 g, 0.0228 mol), and tin(IV) sulfide (4.16 g, 0.0228 mol) were mixed together by shaking for 15 min. The mixture was placed in a 20 mL alumina boat, which was then put into a tube furnace with nitrogen flow. The boat was heated from ambient temperature to 800° C. in 15 min, and kept at this temperature for 1 day. The sample was cooled down to ambient temperature, ground, and then placed back into the boat and the tube furnace under nitrogen flow. The heating cycle was then repeated. This procedure was repeated 4 times, giving a total heating time of 5 days. The sample was analyzed by XRD to confirm presence of CZTS crystals. The crystals were media-milled to provide microparticles with D50 of 1.0078 micron and D95 of 2.1573 microns.

Examples 1-1K

Aqueous Synthesis of CZTS, CTS, CIS and CuS Particles

In the procedures of Example 1, aqueous stock solutions of $CuSO_4$, $ZnSO_4$, $NH_4NO_3$, $SnCl_4$, triethanolamine (TEA) and thioacetamide (TAA) were prepared in nanopure water and used in the amounts indicated in Table 1.

Example 1A

This example demonstrates the synthesis of "as-synthesized" nanoparticles that are a precursor to CZTS.

For Expts 1-6, solutions of $CuSO_4$ (0.4 M), $ZnSO_4$ (0.8 M), and $SnCl_4$ (0.7 M) were mixed together in a round bottom flask equipped with a stir bar. Next, solutions of $NH_4NO_3$ (0.4 M) and triethanolamine (TEA, 3.7 M) were sequentially added to the reaction mixture. Sulfuric acid was used to adjust the pH to 1, and the reaction mixture was stirred for 30 min, followed by the addition of aqueous thioacetamide (TAA, 0.4 M). The flask was placed in a hot water bath with magnetic stirring and the reaction temperature was maintained at 80° C. for 2.5 hr to provide a black suspension. Next, the water bath was removed, and the flask was allowed to cool to room temperature. The resulting precipitate was collected via decantation/centrifugation. The solids were washed three times with water. Portions of the material were dried overnight in a vacuum oven at 45, 60 or 200° C. to provide a black powder of the as-synthesized nanoparticles (mixture of Cu, Zn, and Sn sulfides). The powders dried at the three different temperatures were compositionally similar, and these drying temperatures were used interchangeably in further experiments.

Example 1B

This example demonstrates the thermal treatment of "as-synthesized" nanoparticles to form high purity CZTS particles.

The nanoparticles obtained in Expts 1-6 of Example 1A were thermally treated at 550° C. under nitrogen and in a sulfur-rich atmosphere for 2 hr to provide high purity CZTS nanoparticles with a kesterite structure, as confirmed by XRD, HR-TEM, XAS and XRF. The particle sizes as determined from HR-TEM and XRD were in the range of 40 to 80 nm mixed with larger, micron size particles. The bimodal distribution was also confirmed by SAXS.

Example 1C

This example demonstrates the reproducible synthesis of CZTS nanoparticles at a larger scale.

For Expt 6, the procedure of Examples 1A and 1B were followed using 0.4 M $ZnSO_4$ and 0.4 M $SnCl_4$ solutions and larger amounts of reagents. A black powder was isolated. The experiment was repeated 20 times. XRD data indicated high reproducibility of sample preparation.

Example 1D

This example demonstrates the production of CZTS with a range of compositions by varying the ratios of the starting reagents and annealing atmosphere.

For Expts 7-9, the procedure of Example 1A was followed. After washing, the solids were dried overnight in a vacuum oven at 200° C. to provide a black powder (the as-synthesized nanoparticles). A portion of each material was thermally treated at 550° C. under nitrogen (Table 2, Expts 7-N, 8-N and 9-N) and another portion was treated in a sulfur-rich atmosphere (Table 2, Expts 7-S, 8-S, and 9-S) for 2 hr, to render high purity CZTS nanoparticles with kesterite structure as indicated by XRD, having ranges of compositions as indicated in Table 2.

Example 1E

This example demonstrates the formation of lower purity CZTS when using lower ratios of sulfur reagent to metal ions.

The black powder sample of Expt 5 of Example 1A was heated at 550° C. in an atmosphere of nitrogen and sulfur for 2 hr. In this example, the ratio between the moles of chalcogen and total moles of metal ions used in the synthesis is 1. Although some CZTS was produced by this process, the heat-treated nanoparticles were determined by XRD to contain other metal sulfides as well.

Example 1F

This example demonstrates the preparation of CZTS particles using a relatively concentrated set of reagent solutions.

In Expts 10-11, the procedures of Examples 1A and 1B were followed using 0.8 M $CuSO_{4\,(aq)}$, 1.6 M $ZnSO_{4\,(aq)}$, and 1.4 M $SnCl_{4\,(aq)}$, 0.8 M ammonium nitrate and 0.8 M TAA solutions. High purity CZTS nanoparticles were obtained with a kesterite structure, as confirmed by XRD and HR-TEM. The particles size as determined from HR-TEM and XRD were in the range of 40 to 80 nm mixed with larger, micron and sub-micron sized particles. The bimodal distribution was also confirmed by SAXS.

Example 1G

This example demonstrates the variation of particle size with the duration of thermal treatment.

The as-synthesized nanoparticles of Expt 6 of Example 1C were heated at 550° C. under nitrogen for 3 hr to provide high purity CZTS particles with kesterite structure, as indicated by X-ray powder diffraction. The particle sizes, as measured by HR-TEM, were in the range of 0.2 to 0.6 micrometers, and possibly micron-sized particles that are outside of instrument detection limit.

Example 1H

This example demonstrates the synthesis of copper tin sulfide particles.

In Expt 12, the procedures described in Examples 1A and 1B were repeated; however, zinc sulfate solution was not used. The water-washed solids were dried overnight in a vacuum oven at 45° C. to provide a black powder (the as-synthesized nanoparticles). The nanoparticles were heated at 550° C. under nitrogen for 3 hr to provide copper tin sulfide particles ($Cu_2SnS_3$), as indicated by XRD.

Example 1I

This example demonstrates the synthesis of copper indium sulfide particles.

In Expt 13, the procedures described in Examples 1A and 1B were repeated; however, zinc sulfate and tin chloride solutions were not used. Instead, 1.0 mmol of 0.4 M $InCl_{3\,(aq)}$ was used. The water-washed solids were dried overnight in a vacuum oven at 45° C. to provide a black powder (the as-synthesized nanoparticles). The nanoparticles were heated at 550° C. under nitrogen for 3 hr to provide high purity copper indium sulfide particles ($CuInS_2$), as indicated by XRD.

Example 1J

This example demonstrates the synthesis of copper sulfide particles.

In Expt 14, the procedures described in Examples 1A and 1B were repeated; however, zinc sulfate and tin chloride solutions were not used. The water-washed solids were dried overnight in a vacuum oven at 45° C. to provide a black powder (the as-synthesized nanoparticles) of average size 20 nm (FWHM by XRD). The material showed high crystallinity. Heating at 550° C. in a sulfur-rich, nitrogen atmosphere provided larger crystals of over 100 nm by XRD.

Example 1K

This example demonstrates a large-scale synthesis of CZTS nanoparticles.

In Expt 15, the procedure described in Example 1F was repeated on a larger scale. After washing three times with water, the solids were dried overnight in a vacuum oven at 45° C. to provide a black powder (the as-synthesized nanoparticles). The material was thermally treated at 550° C. under nitrogen and sulfur atmosphere for 2 hr to provide high purity CZTS particles with a kesterite structure, as confirmed by XRD and HR-TEM. The particles size distribution is bimodal, as determined by SAXS, having a median of small particles of 31 nm and a median for larger particles of 333 nm.

Example 1L

This example demonstrates the surface analysis of the CZTS particles and the particle size distribution of these particles.

The procedure of Example 1K was conducted on ~0.4 times the scale. Formation of high purity CZTS particles with a kesterite structure was confirmed by XRD with a FWHM of 24 nm. PSD analysis indicated a bimodal distribution with D50 of 0.98 microns and D90 of 1.88 microns. ESCA analysis indicate the presence of surface sulfate groups with a higher $SO_x^{-2}$ to $S^{-2}$ ratio than media-milled CZTS microcrystals having a similar particle size distribution, prepared as described above. Analysis by ToF-SIMS indicated lower levels of trace Fe and Cr than in the media-milled CZTS microcrystals.

TABLE 1

| | Reagents quantities (in mmol) | | | | | |
|---|---|---|---|---|---|---|
| Expt | $CuSO_4$ (mmol) | $ZnSO_4$ (mmol) | $SnCl_4$ (mmol) | $NH_4NO_3$ (mmol) | TEA (mmol) | TAA (mmol) |
| 1 | 2.5 | 1.2 | 1.4 | 1 | 3.8 | 22.8 |
| 2 | 2.75 | 1.2 | 1.4 | 1 | 3.8 | 22.8 |
| 3 | 3 | 1.4 | 1.575 | 1 | 3.8 | 27.6 |
| 4 | 3.25 | 1.4 | 1.575 | 1 | 3.8 | 27.6 |
| 5 | 2.0 | 1.0 | 1.0 | 1.0 | 4.0 | 4.0 |
| 6 | 5.5 | 2.4 | 3.2 | 2 | 7.77 | 45.6 |
| 7 | 2.5 | 1.4 | 1.4 | 1 | 3.8 | 23 |
| 8 | 3 | 1.6 | 1.575 | 1 | 3.9 | 27.6 |
| 9 | 3.2 | 1.6 | 1.575 | 1 | 4.1 | 27.6 |
| 10 | 2.5 | 1.2 | 1.4 | 1 | 3.8 | 22.8 |
| 11 | 3.25 | 1.4 | 1.575 | 1 | 3.8 | 27.6 |
| 12 | 2.75 | — | 1.4 | 1 | 3.8 | 22.8 |
| 13 | 2.0 | — | — | 1.0 | 4.0 | 20.0 |
| 14 | 2.0 | — | — | 1.0 | 4.0 | 20.0 |
| 15 | 25.6 | 11.2 | 12.6 | 8 | 32.56 | 220.8 |

TABLE 2

| | Composition of materials (based on ICPMS data) | | | | | |
|---|---|---|---|---|---|---|
| Expt | Cu | Zn | Sn | S | Cu/(Zn + Sn) | Zn/Sn |
| 7-N | 2.00 | 1.58 | 1.10 | 4.13 | 0.75 | 1.44 |
| 7-S | 2.00 | 1.58 | 1.09 | 5.16 | 0.75 | 1.45 |
| 8-N | 2.00 | 1.21 | 0.87 | 3.15 | 0.96 | 1.39 |
| 8-S | 2.00 | 1.22 | 0.86 | 3.47 | 0.96 | 1.42 |
| 9-N | 2.00 | 1.16 | 0.79 | 3.05 | 1.03 | 1.47 |
| 9-S | 2.00 | 1.14 | 0.79 | 3.40 | 1.04 | 1.44 |

Examples 2A-2C

Ink and Films Derived from As-Synthesized Nanoparticles

These examples demonstrate the use of "as-synthesized" particles to prepare annealed films of CZTS As-synthesized nanoparticles (0.5 g) obtained as described in Expt 4 of Example 1A, were mixed with 4.5 g alpha-terpineol to provide an ink with 10 wt % solids. The ink was rod-coated onto a Mo-coated soda-lime glass substrate with a 3/0 bar in triplicate to generate three thin-film samples. The thin-film samples were allowed to dry on a hot plate at 50° C.

Example 2A

The first thin-film sample was thermally treated in inert atmosphere at 550° C. XRD of the film indicated the presence of high crystallinity kesterite.

Example 2B

The second thin-film sample was thermally treated at 550° C. in inert atmosphere made rich in sulfur by introducing a boat with 2 g of sulfur in the furnace tube. XRD of the film indicated the presence of high crystallinity kesterite, which retained more sulfur than the film of Example 2A, as determined by ICP-MS and XRF analysis.

Example 2C

The third thin-film sample was not thermally treated at 550° C. Kesterite was not observed by XRD.

Example 3

Ink and Films Derived from CZTS Particles

These examples demonstrate the use of CZTS particles to prepare annealed films of CZTS.

CZTS particles (0.5 g), obtained as described in Example 1C, were mixed with 4.5 g alpha-terpineol to provide an ink with 10 wt % solids. The ink was rod-coated onto a Mo-coated soda-lime glass substrate using a 3/0 bar. The film was allowed to dry at 50° C. on a hot plate. Upon drying, the first film was thermally treated in an inert atmosphere at 550° C. X-ray powder diffraction analysis of the film confirmed the kesterite structure.

Example 4

Treatment of CZTS Powders with Capping Agents

These examples demonstrate the treatment of CZTS particles with capping agents and the formation of an annealed CZTS film from coated CZTS particles.

Two aliquots of 100 mg each of CZTS nanoparticles, prepared as described in Example 1C, were mixed with either 1 g oleylamine or 1 g dodecanethiol and horn-sonicated for 2 min, then kept overnight under an inert atmosphere. The next day, each mixture was further dissolved in toluene with vigorous stirring and kept in a sonicator bath for 5 min, then magnetically stirred for an additional 5 min to generate CZTS inks. Each ink was bar-coated onto a soda-lime glass or molybdenum-coated soda-lime glass. The films were annealed in a furnace at 550° C. for 2 hr under a nitrogen atmosphere.

Example 5

Spray-Coating of Films

These examples demonstrate spray-coating of CZTS particles and the use of a pre-heated substrate to generate higher density CZTS films.

CZTS nanoparticles (1 g), prepared according to Example 1C, were suspended in 9 g methanol and horn-sonicated for 10 min. A solution of 2 wt % PVP in methanol (10 g) was mixed with the CZTS-methanol solution. The resulting mixture was sonicated for 5 min, then magnetically stirred for an additional 5 min to generate a CZTS ink. The ink was sprayed with a modified air-brush system onto three glass substrates that were at room temperature, 64.7° C. and 100° C., respectively. The films were annealed in a furnace at 550° C. for 6 hr under nitrogen atmosphere. Film densification and monodispersed micron-size grains were observed via SEM for samples sprayed at temperatures above room temperature.

Example 6

Ink and Films Derived from Highly Crystalline CZTS

This example provides an ultra-pure CZTS composition; all particles of the composition are crystalline and characterized by a kesterite structure.

A 0.20 g sample of the particles prepared in Example 1K was added to 0.8 g of a methanolic solution of 1 wt % PVP to give a 20 wt % solids ink. The ink was tip-sonicated for 15 min, then bath-sonicated for 1 min. The ink was bar-coated onto clean microscope slides and dried on a 60° C. hot plate for 5 min. (Prior to bar-coating, the microscope slides were cleaned by rinsing with acetone, water, and then methanol, dried in air, and then treated with Ar plasma for 2 min.) The coated slides were thermally annealed in a $N_2$/sulfur atmosphere at 550° C. for 2 hr. XRD showed high crystallinity kesterite present in the sample in one crystalline phase. The XAS analysis revealed an ultra-pure material composition, consisting of more than 99% CZTS in the film. The combined XRD and XAS analysis indicate that all particles of the film are crystalline and characterized by a kesterite structure.

What is claimed is:

1. A process comprising:
   (a) providing a first aqueous solution comprising two or more metal salts and one or more ligands;
   (b) optionally, adding a pH-modifying substance to form a second aqueous solution;
   (c) combining the first or second aqueous solution with a chalcogen source to provide a reaction mixture;
   (d) agitating and optionally heating the reaction mixture to produce metal chalcogenide nanoparticles;
   (e) optionally isolating the metal chalcogenide nanoparticles from the reaction mixture; and
   (f) optionally heating the isolated metal chalcogenide nanoparticles to a temperature between about 350° C. and 800° C. to provide crystalline metal chalcogenide nanoparticles.

2. The process of claim 1, wherein the two or more metal salts comprise a copper salt, a tin salt, and optionally a zinc salt.

3. The process of claim 1, wherein the two or more metal salts comprise a copper salt, an indium salt and optionally a gallium salt.

4. The process of claim 1, wherein the reaction mixture is heated to a temperature up to about 100° C.

5. The process of claim 1, wherein the chalcogen source is selected from the group consisting of hydrogen sulfide, hydrogen selenide, alkali metal sulfides, alkali metal selenides, thione-containing compounds, and selenone-containing compounds.

6. The process of claim 1, wherein the ligand is selected from the group consisting of amines, ammonia, ammonium salts, thiols, selenols, organic acids, salts of organic acids, and mixtures thereof.

7. The process of claim 1, wherein a pH-modifying substance is present, and the pH is adjusted to be between about 4 to about 0.

8. Metal chalcogenide nanoparticles produced by the process of claim 1.

9. Crystalline metal chalcogenide nanoparticles produced by the process of claim 1.

10. The metal chalcogenide nanoparticles of claim 8 comprising copper tin sulfide/selenide, copper zinc tin sulfide/selenide, copper indium gallium sulfide/selenide, copper indium sulfide/selenide, or mixtures thereof.

* * * * *